US008273990B2

(12) United States Patent
Lin et al.

(10) Patent No.: US 8,273,990 B2
(45) Date of Patent: Sep. 25, 2012

(54) FLEXIBLE FLAT CIRCUIT CABLE WITH GAPPED SECTION

(75) Inventors: Gwun-Jin Lin, Taoyuan County (TW); Chih-Heng Chuo, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 310 days.

(21) Appl. No.: 12/694,550

(22) Filed: Jan. 27, 2010

(65) Prior Publication Data

US 2011/0094790 A1 Apr. 28, 2011

(30) Foreign Application Priority Data

Oct. 27, 2009 (TW) ................................ 98136307 A (51) Int. Cl.
*H01B 7/08* (2006.01)
(52) U.S. Cl. ................................. 174/117 FF
(58) Field of Classification Search ............... 174/117 F, 174/117 FF, 72 A See application file for complete search history.

(56) References Cited

U.S. PATENT DOCUMENTS 4,092,057 A * 5/1978 Walton ............................. 439/67
2009/0188716 A1 * 7/2009 Nagase ........................ 174/72 A

* cited by examiner

*Primary Examiner* — Chau Nguyen
(74) *Attorney, Agent, or Firm* — Rosenberg, Klein & Lee (57) ABSTRACT

A flexible flat circuit cable includes first and second flexible circuit substrates extending in an extension direction. The first flexible circuit substrate has a first surface forming a first conductor layer and an insulation layer, and the second flexible circuit substrate has a first surface forming a second conductor layer and an insulation layer. A bonding material layer is applied at a predetermined section between the first flexible circuit substrate and the second flexible circuit substrate to bond the first and second flexible circuit substrates together in such a way to maintain a predetermined spacing distance between the first and second flexible circuit substrate and forming a gapped segment at sections where no bonding material is applied. The first and second flexible circuit substrates form a cluster section within the gapped segment, which has opposite ends respectively forming first and second connected sections each of which forms a connection plug or is provided with a connector.

26 Claims, 7 Drawing Sheets

FLEXIBLE FLAT CIRCUIT CABLE WITH GAPPED SECTION

FIELD OF THE INVENTION

The present invention relates to a flexible flat circuit cable, and in particular to a flexible flat circuit cable with a gapped section.

BACKGROUND OF THE INVENTION

In the past decade, flexible circuit cables find wide applications in various systems, especially compact and light-weighted electronic products, and are commonly applied to consumer electronic products, such as mobile phones, digital cameras, computer peripherals, flat displays, and game machines. Among these devices, flat displays and electronic products are of high growth rate, where transmission through the flexible circuit cables is of a vital importance for the development of the electronic industry.

The flexible circuit cables are commonly used in components of electronic devices for signal connection in a folding or rotating part. The most commonly seen application is in a hinge part of an electronic device, which can be a clamshell type, a slip type, a flip type or other three-dimensional rotation structure, where the flexible circuit cables find the most valuable application thereof.

For the known products that use flexible circuit cables, due to the needs for various numbers of transmission lines, various configurations, including a single-sided board, a double-sided board, or a multi-layered board, can be used for the flexible circuit cables. The conventional structure of the flexible circuit cable comprises a plurality of electrical wires that is each covered by an outer insulation jacket and arranged in a side-by-side juxtaposing manner to form a flat configuration, which is used to transmit signals for various electrical equipments, electronic equipments, computer equipments, and telecommunication devices.

SUMMARY OF THE INVENTION

Adopting a flat cable to serve as a transmission line of signals presents no problem in extending through an elongate narrow space. However, hinges of various structures are now commonly used in various electronic devices or communication devices. For example, consumer electronic devices, such as notebook computers, liquid crystal displays, digital cameras, mobile phones, touch panels, and other consumer electronic devices, comprise a cover or a display screen that is connected to a device body through a hinge. To allow electric signals to be transmitted from the device body to the cover or the display screen, a miniaturized flat cable or bundled tiny wires are used as a signal transmission line. In these fields of application, a conventional flat cable faces certain problems, such as adverse influence of operation smoothness of the hinge, insufficient flexibility of the conventional flat cable, and insufficient durability of the conventional flat cable.

In view of these drawbacks, an objective of the present invention is to provide a flexible flat circuit cable having a gapped section to alleviate the drawbacks of the conventional flat cables in practical applications.

The solution adopted in the present invention to overcome the problems of the conventional techniques comprises a flexible flat circuit cable with a gapped section, where the flexible flat circuit cable comprises first and second flexible circuit substrates extending a predetermined length in an extension direction. The first flexible circuit substrate has a first surface sequentially forming a first conductor layer and an insulation layer, and the second flexible circuit substrate has a first surface sequentially forming a second conductor layer and an insulation layer. A bonding material layer is applied at a predetermined section between a second surface of the first flexible circuit substrate and a second surface of the second flexible circuit substrate to bond the first and second flexible circuit substrates together in such a way to maintain a predetermined spacing distance between the first and second flexible circuit substrate and forming a gapped segment at sections where no bonding material is applied.

The first and second flexible circuit substrates form a cluster section within the gapped segment. The cluster section comprises a plurality of cluster strips that are formed by slitting the first and second flexible circuit substrates in the extension direction.

A first connected section is formed at an end of the cluster section and a second connected section is formed at an end of the cluster section that is opposite to the first connected section. The first and second connected sections each form a connection socket for each mating a connector. In other examples, the first connected section and/or the second connected section are respectively provided with a connection plug for plugging in a socket formed in other circuits.

In a preferred embodiment of the present invention, an electromagnetic shielding layer is further provided on an outside surface of the insulation layer of the first conductor layer of the first flexible circuit substrate and an electromagnetic shielding layer is also formed on an outside surface of the insulation layer of the second conductor layer of the second flexible circuit substrate whereby the electromagnetic shielding layers provide electromagnetic shielding to electrical signals transmitted through the flexible flat circuit cable.

According to the present invention, a gapped segment is formed between the second surface of the first flexible circuit substrate and the second surface of the second flexible circuit substrate of the flexible flat circuit cable to provide the flexible flat circuit cable with improved flexibility so as to eliminate the problem of the conventional flat cable that affects the operation smoothness of a hinge when the flat cables are used in hinges having different structures or having a narrow space and also improves the drawbacks of the conventional flat cables in respect of insufficient flexibility and insufficient durability.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
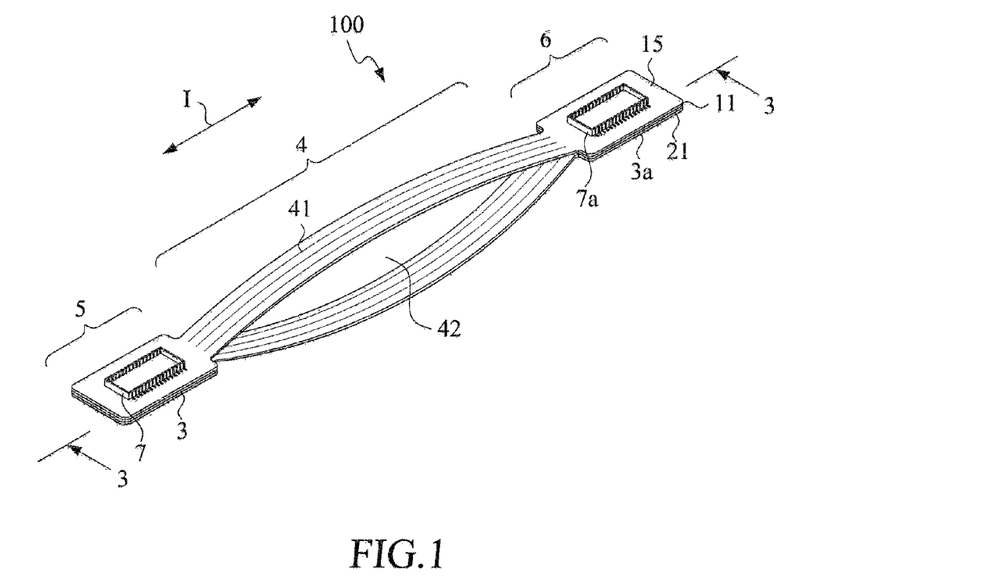
FIG. 1 is a perspective view showing a flexible flat circuit cable constructed in accordance with a first embodiment of the present invention.
Figure 2:
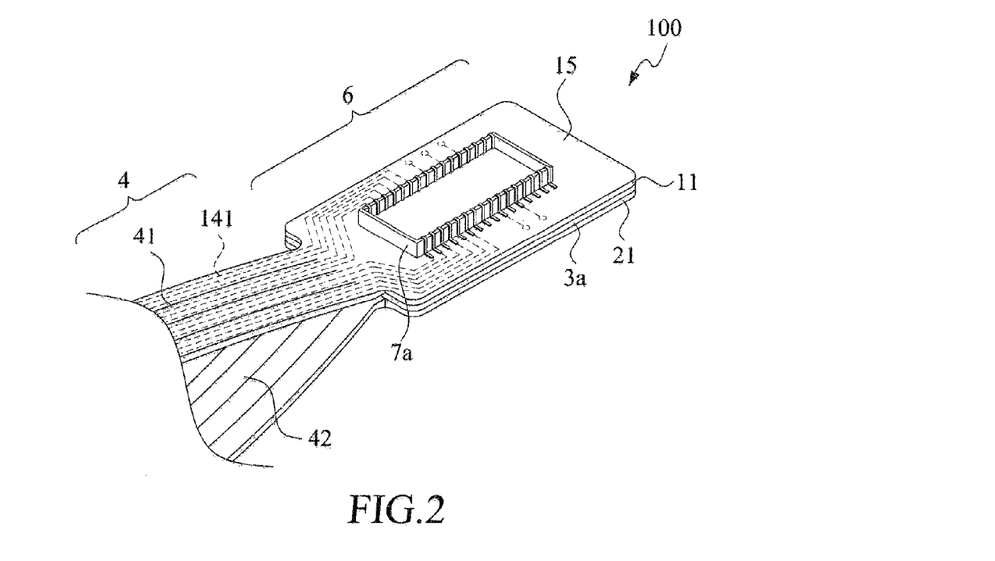
FIG. 2 is a partial enlarged view of the flexible flat circuit cable of the first embodiment of the present invention.
Figure 3:
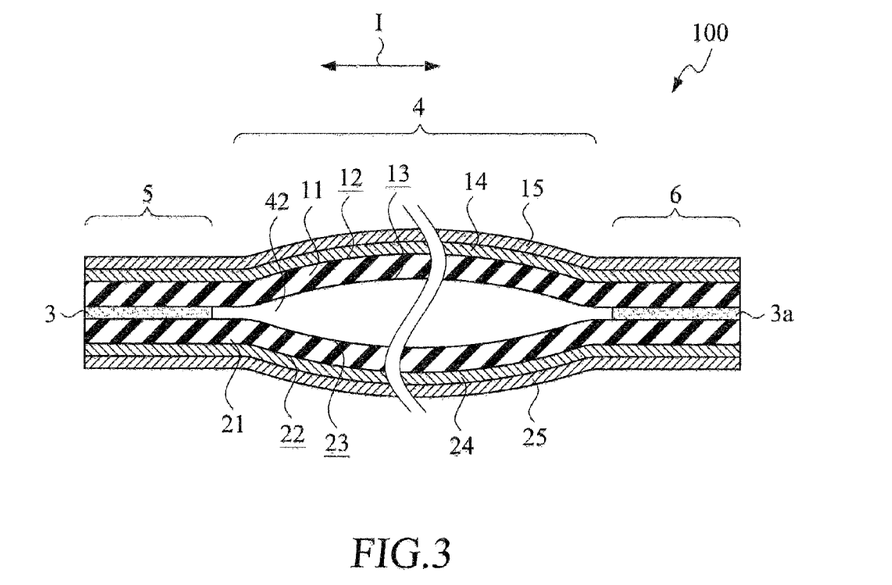
FIG. 3 is a cross-sectional view of the flexible flat circuit cable of the first embodiment of the present invention taken along line 3-3 of FIG. 1.

With reference to the drawings and in particular to FIG. 1, which shows a perspective view of a flexible flat circuit cable constructed in accordance with a first embodiment of the present invention, FIG. 2, which shows a partial enlarged view of the flexible flat circuit cable of the first embodiment of the present invention, and FIG. 3, which is a cross-sectional view of the flexible flat circuit cable of the first embodiment of the present invention taken along line 3-3 of FIG. 1, the flexible flat circuit cable constructed in accordance with the first embodiment of the present invention, generally designated at 100, comprises a constructional combination of two single-sided boards, including a first flexible circuit substrate 11 and a second flexible circuit substrate 21, each extending a predetermined length in an extension direction I. The first flexible circuit substrate 11 has a first surface 12 and an opposite second surface 13, and the second flexible circuit substrate 21 has a first surface 22 and an opposite second surface 23. The second flexible circuit substrate 21 is neatly lapped on the first flexible circuit substrate 11 with the second surface 23 of the second flexible circuit substrate 21 facing toward the second surface 13 of the first flexible circuit substrate 11.

A first conductor layer 14 and an insulation layer 15 are sequentially formed on the first surface 12 of the first flexible circuit substrate 11. A second conductor layer 24 and an insulation layer 25 are sequentially formed on the first surface 22 of the second flexible circuit substrate 21.

As shown in FIG. 3, layers of bonding material 3, 3a are respectively formed on predetermined sections of the second surface 23 of the second flexible circuit substrate 21 and the second surface 13 of the first flexible circuit substrate 11 for bonding and positioning the first flexible circuit substrate 11 and the second flexible circuit substrate 21 with respect to each other in such a way to maintain a predetermined spacing distance between the second surface 13 of the first flexible circuit substrate 11 and the second surface 23 of the second flexible circuit substrate 21 and forming a gapped segment 42 between sections of the first flexible circuit substrate 11 and the first surface 12 where no bonding material layers 3, 3a are formed.

The flexible flat circuit cable of the present invention further comprises a cluster section 4 that is formed of the sections of the first flexible circuit substrate 11 and the second flexible circuit substrate 21 within the gapped segment 42, and a first connected section 5 that is located at an end of the cluster section 4 and a second connected section 6 that is located at an opposite end of the cluster section 4 that is opposite to the first connected section 5. The cluster section 4 comprises a plurality of cluster strips 41 that is formed by slitting the first flexible circuit substrate 11 and the second flexible circuit substrate 21 in the extension direction I. All or some of the cluster strips 41 are provided with signal lines 141, 241.

In the embodiment illustrated, the first connected section 5 and the second connected section 6 are respectively provided with connection sockets 7, 7a for each mating an external connector. In other embodiments, the first connected section 5 and the second connected section 6 may be selectively provided with connection plugs with mating with socket connections of external circuits. The connection can be varied according to practical applications. Further, the first conductor layer 14 and/or the second conductor layer 24 comprises signal lines 141, 241 to serve as electrical signal transmission paths between the first connected section 5 and the second connected section 6.

In the embodiment illustrated, the bonding material layers 3, 3a are each formed of an adhesive layer within each of the first connected section 5 and the second connected section 6. The second surface 23 of the second flexible circuit substrate 21 is stacked on and adhesively bonded to the second surface 13 of the first flexible circuit substrate 11 through the bonding material layers 3, 3a. Thus, the gapped segment 42 is formed between the second surface 13 of the first flexible circuit substrate 11 and the second surface 23 of the second flexible circuit substrate 21. In the present invention, the gapped segment 42 comprises an air gap segment whereby the portions of the first flexible circuit substrate 11 and the second flexible circuit substrate 21 between the first connected section 5 and the second connected section 6 are made more flexible due to the gapped segment 42.

Figure 4:
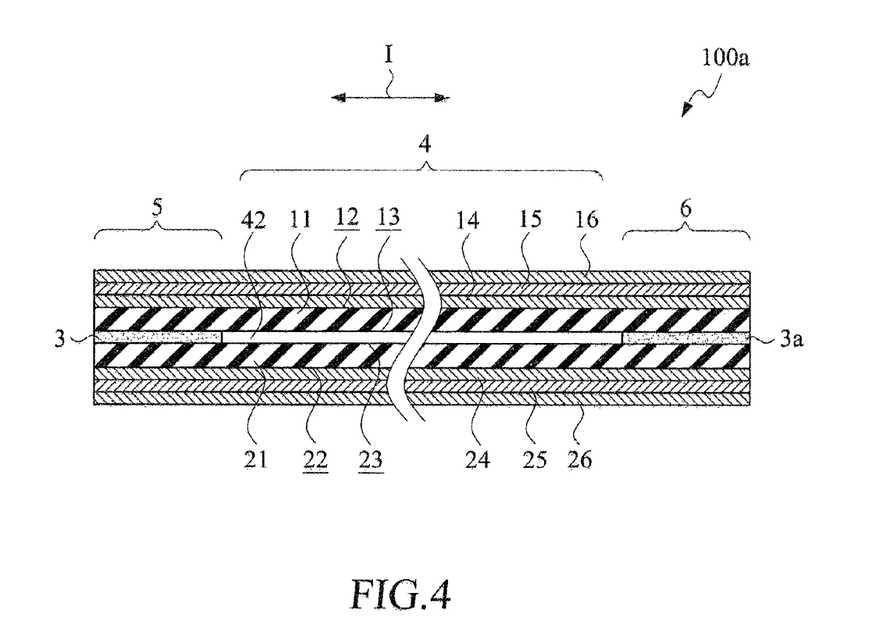
FIG. 4 is a cross-sectional view showing a flexible flat circuit cable constructed in accordance with a second embodiment of the present invention.

Referring to FIG. 4, which shows a cross-sectional view of a flexible flat circuit cable constructed in accordance with a second embodiment of the present invention, the second embodiment flexible flat circuit cable of the present invention, generally designated at 100a, is composed of constituent components that are substantially identical to those of the first embodiment so that similar components bear the same reference numerals for consistence, and correspondence. The flexible flat circuit cable of the second embodiment is different from the flexible flat circuit cable of the first embodiment in that an electromagnetic shielding layer 16 is further formed on an outside surface of the insulation layer 15 of the first conductor layer 14 and similarly, an electromagnetic shielding layer 26 is formed on an outside surface of the insulation layer 25 of the second conductor layer 24. The electromagnetic shielding layers 16, 26 provide electromagnetic shielding for protecting electrical signals.

Figure 5:
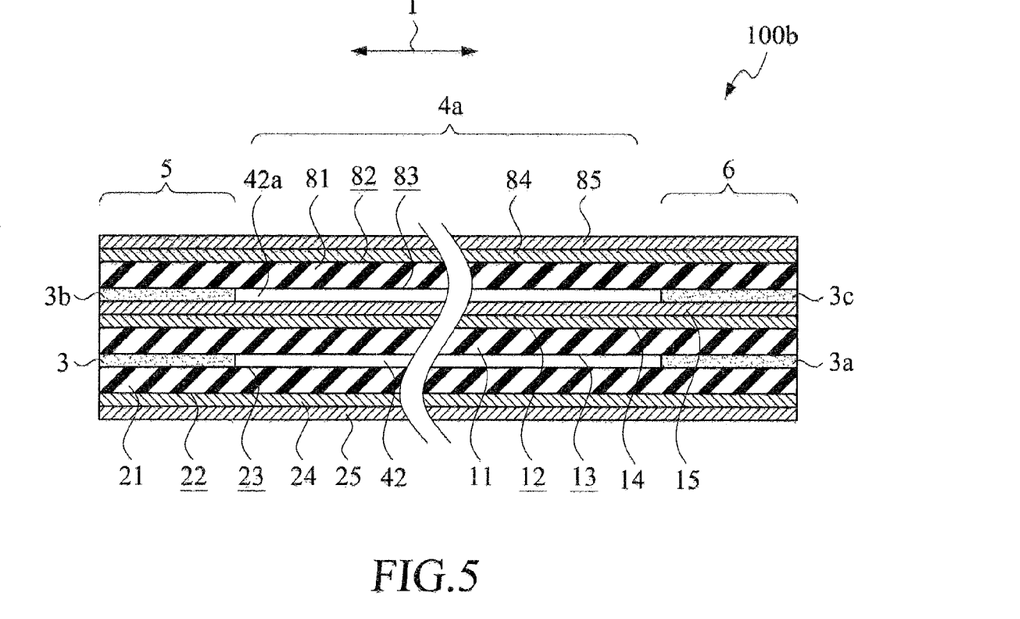
FIG. 5 is a cross-sectional view showing a flexible flat circuit cable constructed in accordance with a third embodiment of the present invention.

Referring to FIG. 5, which shows a cross-sectional view of a flexible flat circuit cable constructed in accordance with a third embodiment of the present invention, the third embodiment flexible flat circuit cable of the present invention, generally designated at 100b, is a constructional combination of two single-sided boards, similar to those of the first and second embodiments, and an additional single-sided board. Structurally, the flexible flat circuit cable 100 of the third embodiment comprises an additional flexible circuit substrate, which is referred to as a third flexible circuit substrate 81. The third flexible circuit substrate 81 has a first surface 82 and an opposite second surface 83. A third conductor layer 84 is formed on the first surface 82 of the third flexible circuit substrate 81 and an insulation layer 85 is formed on an outside surface of the third conductor layer 84.

The second surface 83 of the third flexible circuit substrate 81 is lapped on and bonded to an outside surface of the insulation layer 15 of the first conductor layer 14 of the first flexible circuit substrate 11 by bonding material layers 3b, 3c in such a way that the second surface 83 of the third flexible circuit substrate 81 is set at a predetermined spacing distance from the insulation layer 15 and that a gapped segment 42a is formed between sections of the first flexible circuit substrate 11 and the third flexible circuit substrate 81 where no bonding material layers 3b, 3c are formed thereby providing the configuration as shown.

To suit the needs of practical applications, multiple flexible circuit substrates may be included in the flexible flat circuit cable of the present invention with each flexible circuit substrate forming a conductor layer and an insulation layer and stacked on and bonding to an adjacent flexible circuit substrate in such a way to form a gapped segment therebetween. Here, only preferred embodiments are presented for illustration and explanation.

Figure 6:
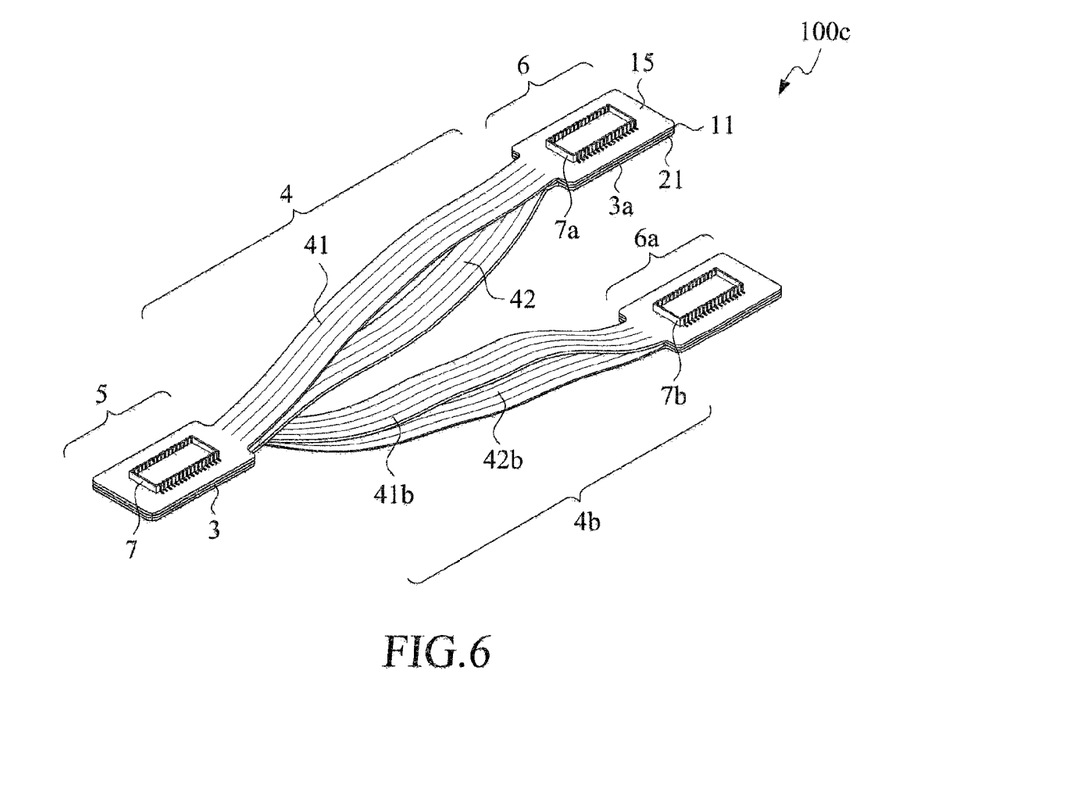
FIG. 6 is a perspective view showing a flexible flat circuit cable constructed in accordance with a fourth embodiment of the present invention.

Referring to FIG. 6, which shows a perspective view of a flexible flat circuit cable constructed in accordance with a fourth embodiment of the present invention, the fourth embodiment flexible flat circuit cable of the present invention, generally designated at 100c, is composed of constituent components that are substantially identical to those of the first embodiment so that similar components bear the same reference numerals for consistence and correspondence. The flexible flat circuit cable 100c of the fourth embodiment is different from the flexible flat circuit cable 100 of the first embodiment in that the flexible flat circuit cable 100c provides a one-to-plurality arrangement. In the structural arrangement of the embodiment shown in FIG. 1, a single second connected section 6 is provided with respect to a first connected section 5, and in the embodiment shown in FIG. 6, two second connected sections 6, 6a are provided for a first connected section 5, and both second connected sections 6, 6a are provided with connection sockets 7a, 7b for each mating an external connector. The connection can be varied according to practical applications.

Figure 7:
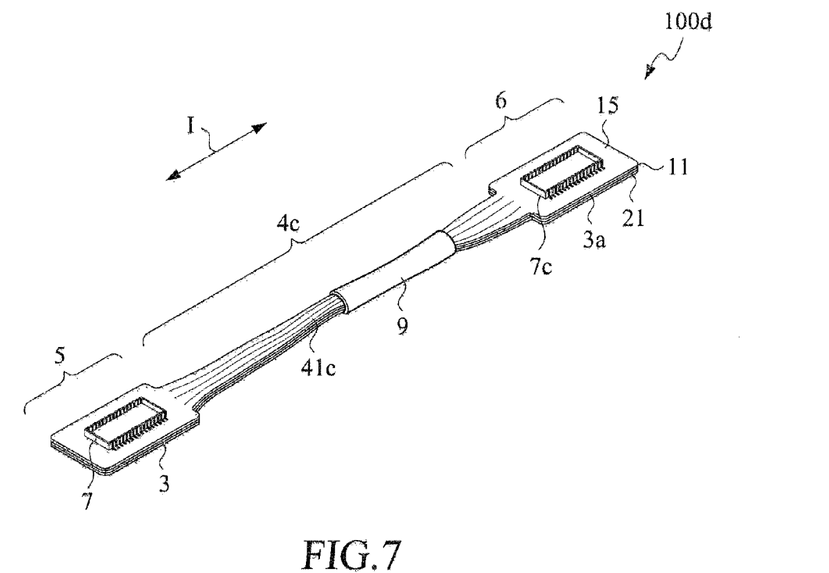
FIG. 7 is a perspective view showing a flexible flat circuit cable constructed in accordance with a fifth embodiment of the present invention.
Figure 8:
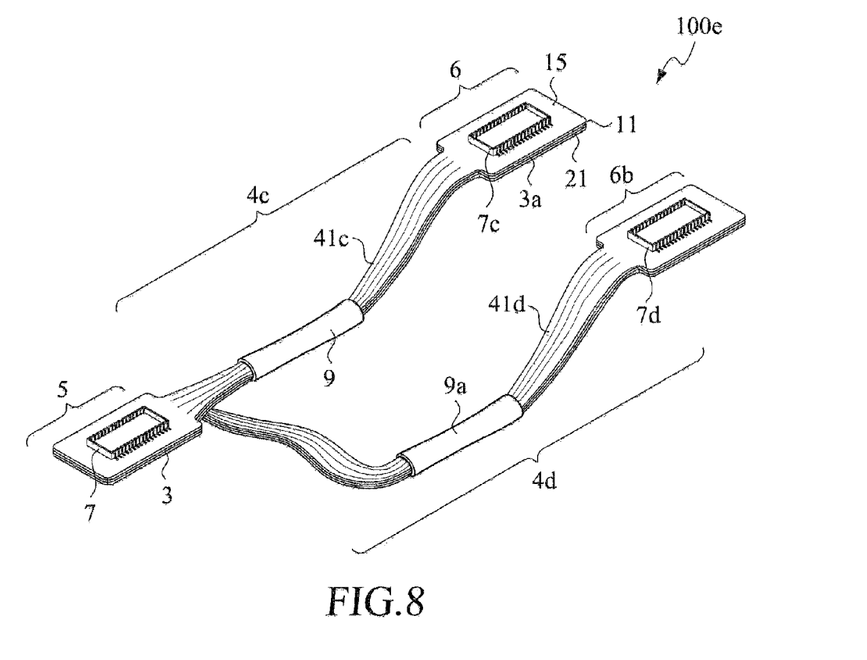
FIG. 8 is a perspective view showing a flexible flat circuit cable constructed in accordance with a sixth embodiment of the present invention.

Referring to FIGS. 7 and 8, which are perspective views respectively showing flexible flat circuit cables constructed in accordance with a fifth embodiment and a sixth embodiment of the present invention, the flexible flat circuit cables of the fifth and sixth embodiments of the present invention, respectively and generally designated at 100d and 100e, are composed of constituent components that are substantially identical to those of the first embodiment so that similar components bear the same reference numerals for consistence and correspondence. In the fifth embodiment, a cluster section 4c is formed between a first connected section 5 and a second connected section 6 and comprises a plurality of cluster strips 41c that is formed by slitting the first flexible circuit substrate 11 and the second flexible circuit substrate 21 in the extension direction I. At least one bundling structure 9 is provided at a predetermined location of the cluster section 4c to loop around or bundle the cluster strips 41c of the cluster section 4c together to form a bundled structure.

On the other hand, the flexible flat circuit cable 100e of the sixth embodiment provides a one-to-plurality arrangement. In the embodiment shown in FIG. 8, the structural arrangement is such that two second connected sections 6, 6b are respectively connected to a first connected section 5 through two cluster sections 4c, 4d, and both second connected sections 6, 6a are provided with connection sockets 7c, 7d. The cluster sections 4c, 4d each comprises a plurality of cluster strips 41c, 41d, and the cluster strips 41c, 41d of the cluster sections 4c, 4d are respectively bundled by bundling structures 9, 9a to each form a bundled structure.

Figure 9:
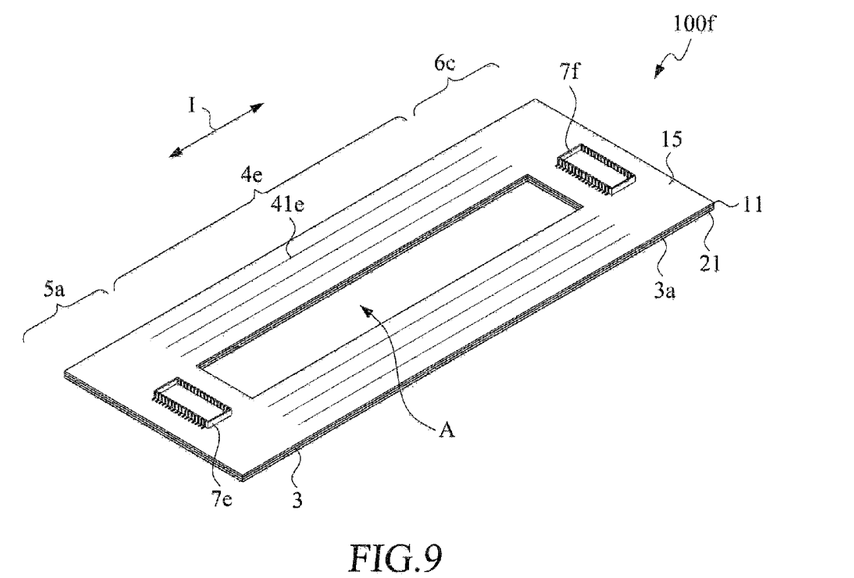
FIG. 9 is a perspective view showing a flexible flat circuit cable constructed in accordance with a seventh embodiment of the present invention.

Referring to FIG. 9, which shows a perspective view of a flexible flat circuit cable constructed in accordance with a seventh embodiment of the present invention, the flexible flat circuit cable of the seventh embodiment of present invention, generally designated at 100f, is composed of constituent components that are substantially identical to those of the first embodiment so that similar components bear the same reference numerals for consistence and correspondence. The flexible flat circuit cable 100f of the seventh embodiment is different from the flexible flat circuit cable 100 of the first embodiment in that a hollow section A is formed between a first connected section 5a and a second connected section 6c. The first connected section 5a and the second connected section 6c are each provided with a connection socket 7e, 7f. In practice, the hollow section A receives a projecting electronic component of a circuit or a pivot of an electronic device to extend therethrough in order to protect the flexible flat circuit cable from being undesired compressed or abraded by the electronic component or the pivot that leads to quick occurrence of damage or breaking of the flexible flat circuit cable or the electronic component of the circuit.

Further, a cluster section 4e is formed between the first connected section 5a and the second connected section 6c beside the hollow section A to suit the needs of practical applications.

Figure 10:
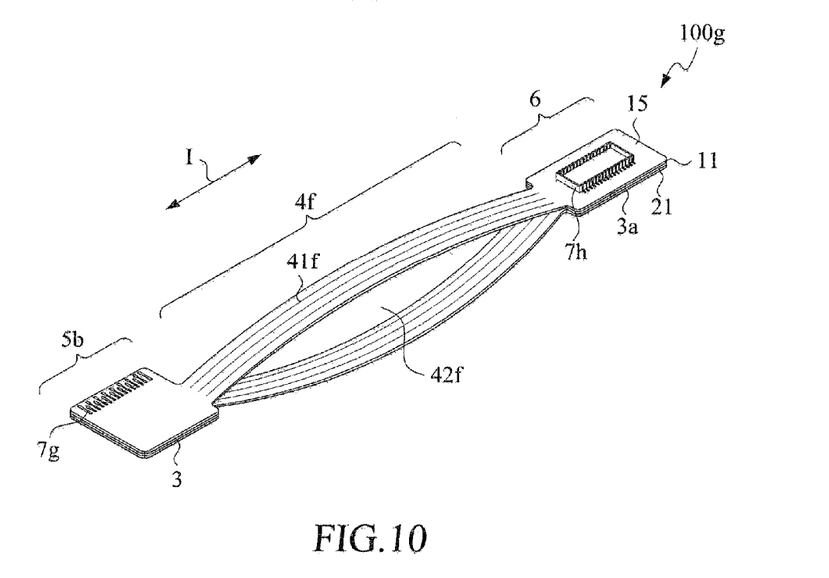
FIG. 10 is a perspective view showing a flexible flat circuit cable constructed in accordance with an eighth embodiment of the present invention.

Referring to FIG. 10, which shows a perspective view of a flexible flat circuit cable constructed in accordance with an eighth embodiment of the present invention, the flexible flat circuit cable of the eighth embodiment of present invention, generally designated at 100g, is composed of constituent components that are substantially identical to those of the first embodiment so that similar components bear the same reference numerals for consistence and correspondence. The flexible flat circuit cable 100g of the eighth embodiment is different from the flexible flat circuit cable 100 of the first embodiment in that a first connected section 5b of the flexible flat circuit cable 100g is provided with a connection plug 7g and a second connected section 6 is provided with a connection socket 7h. The connection plug 7g can mate a connection socket of an external circuit in a plugging manner and may comprise a plugging structure formed of a plurality of conductive pins that is often referred to as gordon finger or a sculpture plug structure. The connection socket 7h functions to receive an external connector to plug therein.

Figure 11:
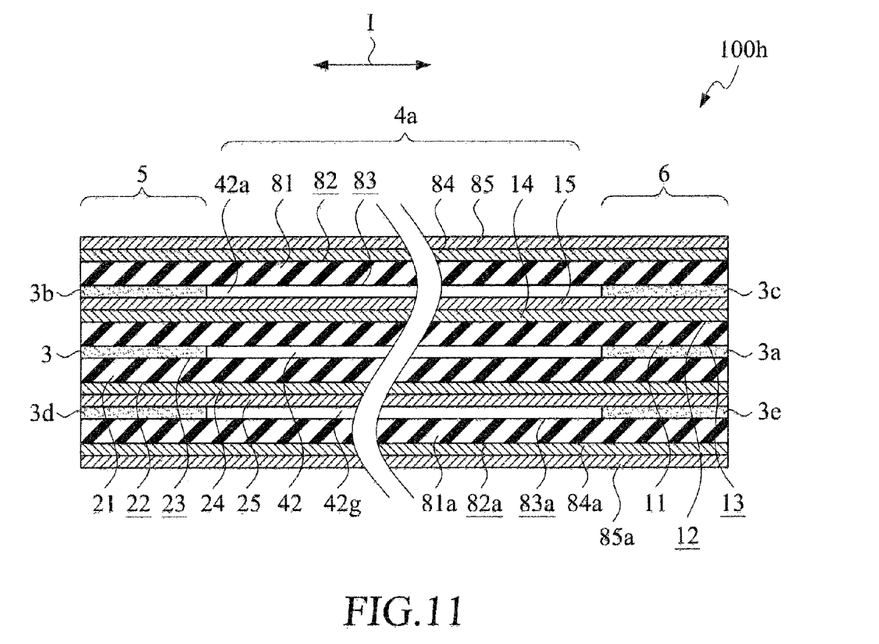
FIG. 11 is a cross-sectional view showing a flexible flat circuit cable constructed in accordance with a ninth embodiment of the present invention.

Referring to FIG. 11, which shows a cross-sectional view of a flexible flat circuit cable constructed in accordance with a ninth embodiment of the present invention, the flexible flat circuit cable of the ninth embodiment of the present invention, generally designated at 100h, is a constructional combination of two single-sided boards, similar to those of the first and second embodiments, each being added with an additional single-sided board. Structurally, the flexible flat circuit cable 100h of the ninth embodiment is different from the third embodiment of FIG. 5 in that a further additional flexible circuit substrate is included and is referred to as a fourth flexible circuit substrate 81a. The fourth flexible circuit substrate 81a has a first surface 82a and an opposite second surface 83a. A fourth conductor layer 84a is formed on the first surface 82a of the fourth flexible circuit substrate 81a and an insulation layer 85a is formed on an outside surface of the fourth conductor layer 84a.

The second surface 83a of the fourth flexible circuit substrate 81a is lapped on and bonded to an outside surface of the insulation layer 25 of the second conductor layer 24 of the second flexible circuit substrate 21 by bonding material layers 3d, 3e in such a way that the second surface 83a of the fourth flexible circuit substrate 81a is set at a predetermined spacing distance from the insulation layer 25 and that a gapped segment 42g is formed between sections of the second flexible circuit substrate 21 and the fourth flexible circuit substrate 81a where no bonding material layers 3d, 3e are formed thereby providing the configuration as shown.

Figure 12:
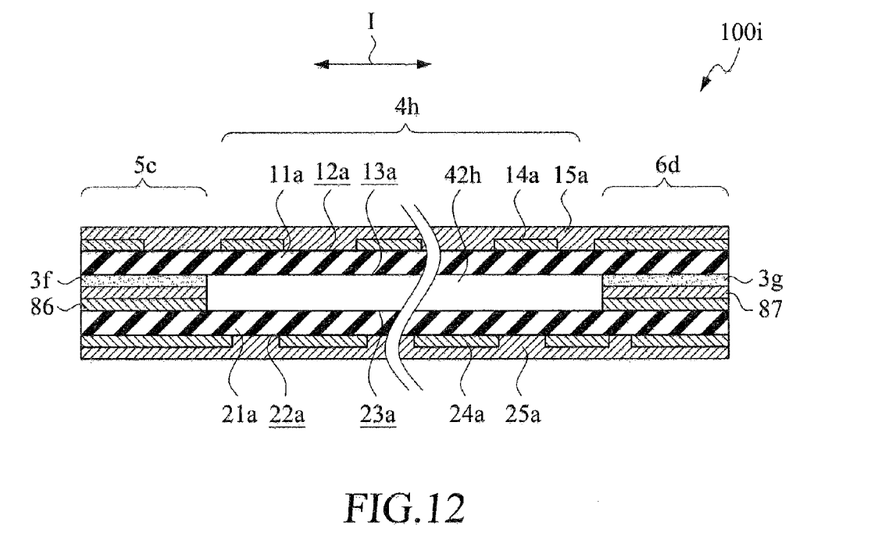
FIG. 12 is a cross-sectional view showing a flexible flat circuit cable constructed in accordance with a tenth embodiment of the present invention.
Figure 13:
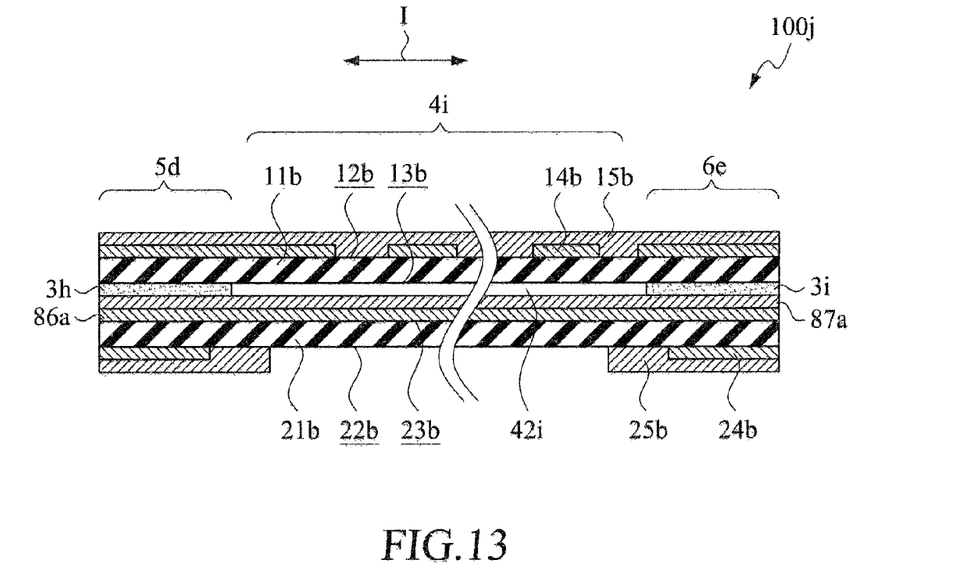
FIG. 13 is a cross-sectional view showing a flexible flat circuit cable constructed in accordance with an eleventh embodiment of the present invention.

Referring to FIGS. 12 and 13, which are cross-sectional views respectively showing flexible flat circuit cables constructed in accordance with a tenth embodiment and an eleventh embodiment of the present invention, the flexible flat circuit cables of the tenth and eleventh embodiments of the present invention, respectively and generally designated at 100i and 100j, both comprise a structural combination of a single-sided board and a double-sided board.

In the tenth embodiment of FIG. 12, the double-sided board comprises a second flexible circuit substrate 21a, a second conductor layer 24a formed on a first surface 22a of the second flexible circuit substrate 21a, and a fifth conductor layer 86 formed on a second surface 23a of the second flexible circuit substrate 21a. The fifth conductor layer 86 may be formed with etching to form on a predetermined section of the second surface 23a of the second flexible circuit substrate 21a. An insulation layer 87 is further formed on a surface of the fifth conductor layer 86.

The single-sided board comprises a first flexible circuit substrate 11a having a second surface 13a that is lapped on and bonded to the insulation layer 87 by bonding material layers 3f, 3g for bonding and positioning the first flexible circuit substrate 11a and the second flexible circuit substrate 21a with respect to each other in such a way to form a gapped segment 42h between sections of the first flexible circuit substrate 11a and the second flexible circuit substrate 21a where no bonding material layers 3f, 3g are formed and insulation layers 15a, 25a are respectively formed to cover the first surface 12a and the first conductor layer 14a of the first flexible circuit substrate 11a and the first surface 22a and the second conductor layer 24a of the second flexible circuit substrate 21a to provide the configuration as shown.

Similarly, in the eleventh embodiment of FIG. 13, the double-sided board comprises a second flexible circuit substrate 21b, a second conductor layer 24b formed on a first surface 22b of the second flexible circuit substrate 21b, and a fifth conductor layer 86a formed on a second surface 23b of the second flexible circuit substrate 21b. An insulation layer 87a is formed on a surface of the fifth conductor layer 86a.

The single-sided board comprises a first flexible circuit substrate 11b having a second surface 13b that is lapped on and bonded to the insulation layer 87a by bonding material layers 3h, 3i for bonding and positioning the first flexible circuit substrate 11b and the second flexible circuit substrate 21b with respect to each other in such a way to form a gapped segment 42i between sections of the first flexible circuit substrate 11b and the first surface 12b where no bonding material layers 3h, 3i are formed and insulation layers 15b, 25b are respectively formed to cover the first surface 12b and the first conductor layer 14b of the first flexible circuit substrate 11b and a portion of the first surface 22b and the second conductor layer 24b of the second flexible circuit substrate 21b to provide the configuration as shown.

Figure 14:
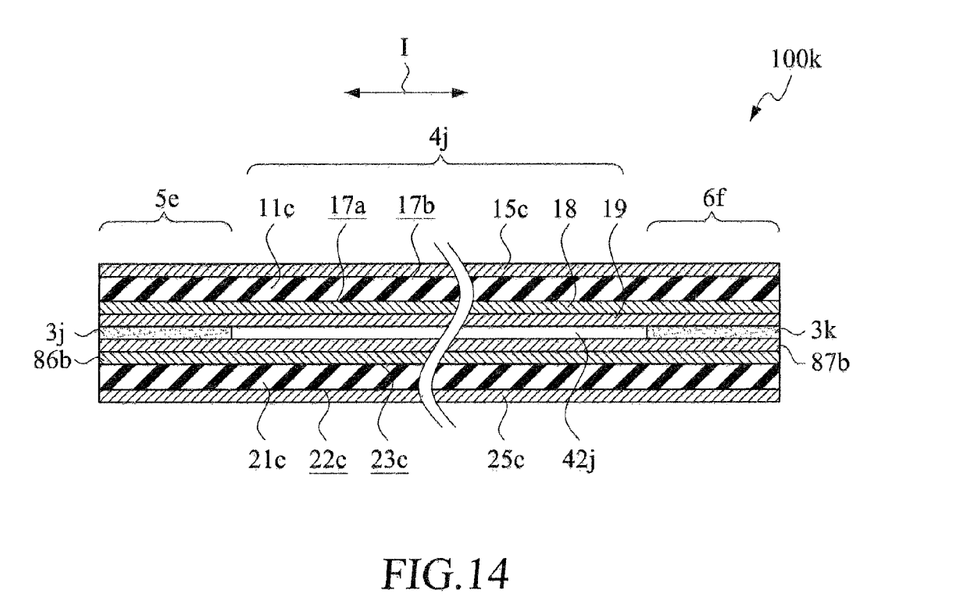
FIG. 14 is a cross-sectional view showing a flexible flat circuit cable constructed in accordance with a twelfth embodiment of the present invention.

Referring to FIG. 14, which is a cross-sectional view showing a flexible flat circuit cable constructed in accordance with a twelfth embodiment of the present invention, the flexible flat circuit cable of the twelfth embodiment of the present invention, generally designated at 100k, comprises a structural combination of two double-sided boards. In the embodiment illustrated, one of the double-sided boards comprises a first flexible circuit substrate 11c having a first surface 17a and an opposite second surface 17b. A first conductor layer 18 is formed on the first surface 17a of the first flexible circuit substrate 11c and an insulation layer 19 is formed on the first conductor layer 18.

Another one of the double-sided boards comprises a second flexible circuit substrate 21c having a first surface 22c and an opposite second surface 23c. A second conductor layer 86b is formed on the second surface 23c of the second flexible circuit substrate 21c and an insulation layer 87b is formed on the second conductor layer 86b.

The insulation layer 19 of the first surface 17a of the first flexible circuit substrate 11c of the first double-sided board is lapped on and bonded to the insulation layer 87b of second surface 23c of the second flexible circuit substrate 21c of the second double-sided board by bonding material layers 3j, 3k for bonding and positioning the first flexible circuit substrate 11c and the second flexible circuit substrate 21c with respect to each other in such a way to form a gapped segment 42j between sections of the first flexible circuit substrate 11c and the second flexible circuit substrate 21c where no bonding material layers 3j, 3k are formed. Insulation layers 15c, 25c are respectively formed on the second surface 17b of the first flexible circuit substrate 11c and the first surface 22c of the second flexible circuit substrate 21c to provide the configuration as shown.

In other applications, the second conductor layer 86b of the second flexible circuit substrate 21c and/or the first conductor layer 18 of the first flexible circuit substrate 11c can be formed on predetermined sections (not shown) of the second flexible circuit substrate 21c and the first flexible circuit substrate 11c by etching to suit the needs of practical applications.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible flat circuit cable, comprising:
   a first flexible circuit substrate, which extends in an extension direction and has a first surface and a second surface;
   a first conductor layer, which is formed on the first surface of the first flexible circuit substrate;
   a second flexible circuit substrate, which has a first surface and a second surface, the second flexible circuit substrate being stacked on the first flexible circuit substrate in an aligned arrangement with the second surface of the second flexible circuit substrate facing the second surface of the first flexible circuit substrate;
   a second conductor layer, which is formed on the first surface of the second flexible circuit substrate;
   a bonding material layer, which is applied to a predetermined section between the second surface of the second flexible circuit substrate and the second surface of the first flexible circuit substrate for bonding and positioning the first flexible circuit substrate and the second flexible circuit substrate with respect to each other in such a way to maintain a predetermined spacing distance between the second surface of the first flexible circuit substrate and the second surface of the second flexible circuit substrate and forming a gapped segment at sections where no bonding material is applied;

a cluster section, which is formed of sections of the first flexible circuit substrate and the second flexible circuit substrate within the gapped segment and comprises a plurality of cluster strips that are formed by slitting the first flexible circuit substrate and the second flexible circuit substrate in the extension direction;

an insulation layer formed on a surface of at least one of the first and second conductor layers; and an electromagnetic shielding layer formed on the insulation layer.

2. The flexible flat circuit cable as claimed in claim 1 further comprising said insulation layer formed on the first conductor layer.

3. The flexible flat circuit cable as claimed in claim 2 further comprising at least one additional flexible circuit substrate having a first surface and a second surface, the second surface of the additional flexible circuit substrate being positioned on and bonded to the insulation layer through application of a bonding material layer in such a way to maintain a predetermined spacing distance between the second surface of the additional flexible circuit substrate and the insulation layer and forming a gapped segment at sections where no bonding material is applied.

4. The flexible flat circuit cable as claimed in claim 3, wherein the first surface of the additional flexible circuit substrate comprises a conductor layer formed thereon and an insulation layer formed on a surface of the conductor layer.

5. The flexible flat circuit cable as claimed in claim 1 further comprising said insulation layer formed on the second conductor layer.

6. The flexible flat circuit cable as claimed in claim 5 further comprising at least one additional flexible circuit substrate having a first surface and a second surface, the second surface of the additional flexible circuit substrate being positioned on and bonded to the insulation layer through application of a bonding material layer in such a way to maintain a predetermined spacing distance between the second surface of the additional flexible circuit substrate and the insulation layer and forming a gapped segment at sections where no bonding material is applied.

7. The flexible flat circuit cable as claimed in claim 6, wherein the first surface of the additional flexible circuit substrate comprises a conductor layer formed thereon and an insulation layer formed on a surface of the conductor layer.

8. The flexible flat circuit cable as claimed in claim 1, wherein the bonding material layer comprises an adhesive layer for adhesively bonding the first flexible circuit substrate and the second flexible circuit substrate together.

9. The flexible flat circuit cable as claimed in claim 1, wherein said insulation layer comprises a first insulation layer and a second insulation layer, wherein said electromagnetic shielding layer comprises a first electromagnetic shielding layer and a second electromagnetic shielding layer, and wherein said first insulation layer is formed on the surface of the first conductor layer; and said first electromagnetic shielding layer is formed on the first insulation layer.

10. The flexible flat circuit cable as claimed in claim 9, wherein said second insulation layer is formed on the surface of the second conductor layer; and said second electromagnetic shielding layer is formed on the second insulation layer.

11. The flexible flat circuit cable as claimed in claim 1 further comprising a first connected section and a second connected section, the first connected section being located at an end of the cluster section, the second connected section being located at an opposite end of the cluster section that is opposite to the first connected section.

12. The flexible flat circuit cable as claimed in claim 11, wherein the first connected section forms a connection plug or is provided with a connector.

13. The flexible flat circuit cable as claimed in claim 11, wherein the second connected section forms a connection plug or is provided with a connector.

14. The flexible flat circuit cable as claimed in claim 11 further comprising a hollow section formed between the first connected section and the second connected section.

15. The flexible flat circuit cable as claimed in claim 1 further comprising a bundling structure that is set at a predetermined location of the cluster section to bundle the cluster strips of the cluster section together to form a bundled structure.

16. A flexible flat circuit cable, comprising:

a first flexible circuit substrate, which extends in an extension direction and has a first surface and a second surface;

a first conductor layer, which is formed on the first surface of the first flexible circuit substrate;

a second flexible circuit substrate, which has a first surface and a second surface, the second flexible circuit substrate being stacked on the first flexible circuit substrate in an aligned arrangement with the second surface of the second flexible circuit substrate facing the second surface of the first flexible circuit substrate;

a second conductor layer, which is formed on the first surface of the second flexible circuit substrate;

an intermediate conductor layer, which is formed on the second surface of the second flexible circuit substrate;

an insulation layer, which is formed on the intermediate conductor layer;

a bonding material layer, which is applied to a predetermined section between the insulation layer and the second surface of the first flexible circuit substrate for bonding and positioning the first flexible circuit substrate and the second flexible circuit substrate with respect to each other in such a way to form a gapped segment at sections where no bonding material is applied; and a cluster section, which is formed of sections of the first flexible circuit substrate and the second flexible circuit substrate within the gapped segment and comprises a plurality of cluster strips that are formed by slitting the first flexible circuit substrate and the second flexible circuit substrate in the extension direction.

17. The flexible flat circuit cable as claimed in claim 16, wherein the intermediate conductor layer is formed a predetermined section of the second surface of the second flexible circuit substrate.

18. The flexible flat circuit cable as claimed in claim 16, wherein the first conductor layer and the second conductor layer each comprises an additional insulation layer formed thereon.

19. The flexible flat circuit cable as claimed in claim 16, wherein the bonding material layer comprises an adhesive layer.

20. The flexible flat circuit cable as claimed in claim 16 further comprising a first connected section and a second connected section, the first connected section being located at an end of the cluster section, the second connected section being located at an opposite end of the cluster section that is opposite to the first connected section.

21. The flexible flat circuit cable as claimed in claim 16, wherein the first connected section and the second connected section each forms a connection plug or are each provided with a connector.

22. A flexible flat circuit cable, comprising:
- a first flexible circuit substrate, which extends in an extension direction and has a first surface and a second surface;
- a first conductor layer, which is formed on the first surface of the first flexible circuit substrate;
- a first insulation layer, which is formed on the first conductor layer;
- a second flexible circuit substrate, which has a first surface and a second surface, the second flexible circuit substrate being stacked on the first flexible circuit substrate in an aligned arrangement with the second surface of the second flexible circuit substrate facing the first surface of the first flexible circuit substrate;
- a second conductor layer, which is formed on the second surface of the second flexible circuit substrate;
- a second insulation layer, which is formed on the second conductor;
- a bonding material layer, which is applied to a predetermined section directly between the second insulation layer of the second flexible circuit substrate and the first insulation layer of the first flexible circuit substrate for bonding and positioning the first flexible circuit substrate and the second flexible circuit substrate with respect to each other in such a way to form a gapped segment at sections where no bonding material is applied; and
- a cluster section, which is formed of sections of the first flexible circuit substrate and the second flexible circuit substrate within the gapped segment and comprises a plurality of cluster strips that are formed by slitting the first flexible circuit substrate and the second flexible circuit substrate in the extension direction.

23. The flexible flat circuit cable as claimed in claim 22, wherein the second surface of the first flexible circuit substrate and the first surface of the second flexible circuit substrate each forms an insulation layer thereon.

24. The flexible flat circuit cable as claimed in claim 22, wherein the bonding material layer comprises an adhesive layer.

25. The flexible flat circuit cable as claimed in claim 22 further comprising a first connected section and a second connected section, the first connected section being located at an end of the cluster section, the second connected section being located at an opposite end of the cluster section that is opposite to the first connected section.

26. The flexible flat circuit cable as claimed in claim 22, wherein the first connected section and the second connected section each forms a connection plug or are each provided with a connector.

* * * * *